US009945495B2

(12) United States Patent
Abudawood et al.

(10) Patent No.: US 9,945,495 B2
(45) Date of Patent: Apr. 17, 2018

(54) REPROGRAMMABLE TESTING CIRCUIT FOR TESTING MULTIPLE TYPES OF VALVES

(71) Applicant: King Abdulaziz City for Science and Technology, Riyadh (SA)

(72) Inventors: Tarek Abudawood, Riyadh (SA); Mohammad Essam Bajowda, Riyadh (SA); Saad Dhaffer Aldosary, Riyadh (SA); Mohammad Hamed Alharbi, Riyadh (SA)

(73) Assignee: KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 223 days.

(21) Appl. No.: 14/813,836

(22) Filed: Jul. 30, 2015

(65) Prior Publication Data

US 2017/0030479 A1 Feb. 2, 2017

(51) Int. Cl.
*F16K 37/00* (2006.01)
*B64F 5/60* (2017.01)
*G01R 31/00* (2006.01)

(52) U.S. Cl.
CPC .......... *F16K 37/0041* (2013.01); *B64F 5/60* (2017.01); *F16K 37/0075* (2013.01); *G01R 31/00* (2013.01)

(58) Field of Classification Search
CPC .... F16K 37/0041; F16K 37/0075; B64F 5/60; G01R 31/00

(Continued)

(56) References Cited

U.S. PATENT DOCUMENTS 6,463,730 B1 10/2002 Keller et al.
6,631,882 B2 * 10/2003 MacK ................ F16K 37/0083
251/129.04

(Continued)

FOREIGN PATENT DOCUMENTS

CN 201707220 1/2011
CN 202108811 1/2011

(Continued)

OTHER PUBLICATIONS

Unknown, "Introduction to Bleed Air System", Bombardier Global Express—Integrated Air Management System, Date Unknown, 68 pages.

(Continued)

*Primary Examiner* — Kevin Murphy
*Assistant Examiner* — Patrick Williams
(74) *Attorney, Agent, or Firm* — Andrew M. Calderon; Roberts Mlotkowski Safra Cole & Calderon, P.C.

(57) ABSTRACT

A reprogrammable testing circuit for testing different types of valves may obtain a direction limit for a valve; obtain a test direction input for the valve; determine whether the direction limit of the valve has been reached or when there is an attempt to exceed it based on a current position of the valve, the test direction input, a valve test procedure; run a customized test on the valve in a direction of the direction input based on determining that the direction limit has not been reached; actively comparing the current position of the valve with the direction limit while running the customized test; and discontinue the customized test when the current position of the valve reaches the direction limit.

20 Claims, 6 Drawing Sheets

(58) Field of Classification Search
USPC ...................................... 251/139.04; 137/554
See application file for complete search history.

(56) References Cited

U.S. PATENT DOCUMENTS

| | | | |
|---|---|---|---|
| 8,342,478 B1 * | 1/2013 | Cordray | F16K 37/0075 |
| | | | 137/554 |
| 8,434,310 B2 | 5/2013 | Baxter et al. | |
| 2005/0000580 A1 * | 1/2005 | Tranovich | F15B 13/0402 |
| | | | 137/625.65 |
| 2013/0313454 A1 * | 11/2013 | Stubbs | F16K 31/046 |
| | | | 251/129.04 |
| 2014/0283918 A1 * | 9/2014 | Dederich | F16K 31/046 |
| | | | 137/8 |

FOREIGN PATENT DOCUMENTS

| | | |
|---|---|---|
| EP | 1550925 | 7/2005 |
| WO | WO-2002004797 | 1/2002 |

OTHER PUBLICATIONS

Unknown, "Airbus A340-300 Full Flight Simulator", Lufthansa List of Malfunctions FT27 Flight Training, Feb. 2014, 163 pages.
Unknown, "Pressure Regulation Valve Testing Manual, Part No. B17CA1042 817CA1042 AMDT A", Airbus Company, 2012, 22 pages.

* cited by examiner

REPROGRAMMABLE TESTING CIRCUIT FOR TESTING MULTIPLE TYPES OF VALVES

FIELD OF THE INVENTION

The invention relates to electronic testing circuits, and more particularly, to electronic testing circuits for testing multiple different types of valves.

BACKGROUND

Electronic testing circuits may be used to test the functionality of valves and/or valve motors, such as hot air trim valves used in aircrafts for temperature and pressure control. Different types of valves for different applications have various design constraints. For example, different types of valves may have different number of input bits, rotation steps, and open/close limits, e.g., the maximum angle at which the valve can open or close in either clockwise or counterclockwise directions.

Specialized electronic testing equipment is usually designed to test a particular type of valve with consideration to the design constraints for the particular valve. The design of testing equipment is usually encapsulated into a large analog circuit. However, testing equipment for one particular valve may not be suitable to test other types of valves, e.g., since different types of valves have different constraints, such as number of input bits, rotation steps, and open/close limits, etc.

SUMMARY

In an aspect of the invention, a method may include obtaining a direction limit for a valve; obtaining a test direction input for the valve; determining whether the direction limit of the valve has been reached based on a current position of the valve and the test direction input; running a customized test on the valve in a direction of the direction input based on determining that the direction limit has not been reached; actively comparing the current position of the valve with the direction limit while running the customized test; and discontinuing the customized test when the current position of the valve reaches the direction limit. The customized test identifies a test procedure that determines the movement of the valve in clockwise or counter clockwise direction.

In an aspect of the invention, a method may include determining whether a direction limit of a valve has been reached based on a current position of the valve, input pulses, and a test direction input; running a customized test on the valve in a direction of the direction input when the direction limit has not been reached, and outputting control signals to a stepper motor connected to the valve to drive the stepper motor; actively comparing the current position of the valve with the direction limit while running the customized test; and discontinuing the customized test when the current position of the valve reaches the direction limit.

In an aspect of the invention, a reprogrammable testing circuit for testing different types of valves may obtain a direction limit for a valve; and test the valve without exceeding the direction limit of the valve.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to electronic testing circuits, and more particularly, to electronic testing circuits for testing multiple different types of valves. More specifically, embodiments of the invention are directed to an electronic testing circuit that is reprogrammable with the testing procedures and constraints of different valves, e.g., the number of input terminals, rotation steps, and open/close limits. Advantageously, embodiments of the present invention may test multiple types of valves without the need to redesign electronic testing circuits for each type of valve. For example, the testing circuit is reprogrammable with the constraints of different valves, e.g., the number of input bits, rotation angles, rotation steps, and open/close limits of the valve. Other advantage of the electronic testing circuit, in accordance with aspects of the present invention, is the ability to track the status of the testing procedure of the valve through visual and audible components. For example, the input bits to the valve and the open/close limit are displayed through a set of LEDs. Also, an error/warning when the signal input to the valve attempts to exceed the open/close limits is displayed on an LED and an error/warning sound is output additionally to indicate the captured error. As a result of having reprogrammable and visual/audible functionalities, testing of various valve types may be simplified.

Figure 1:
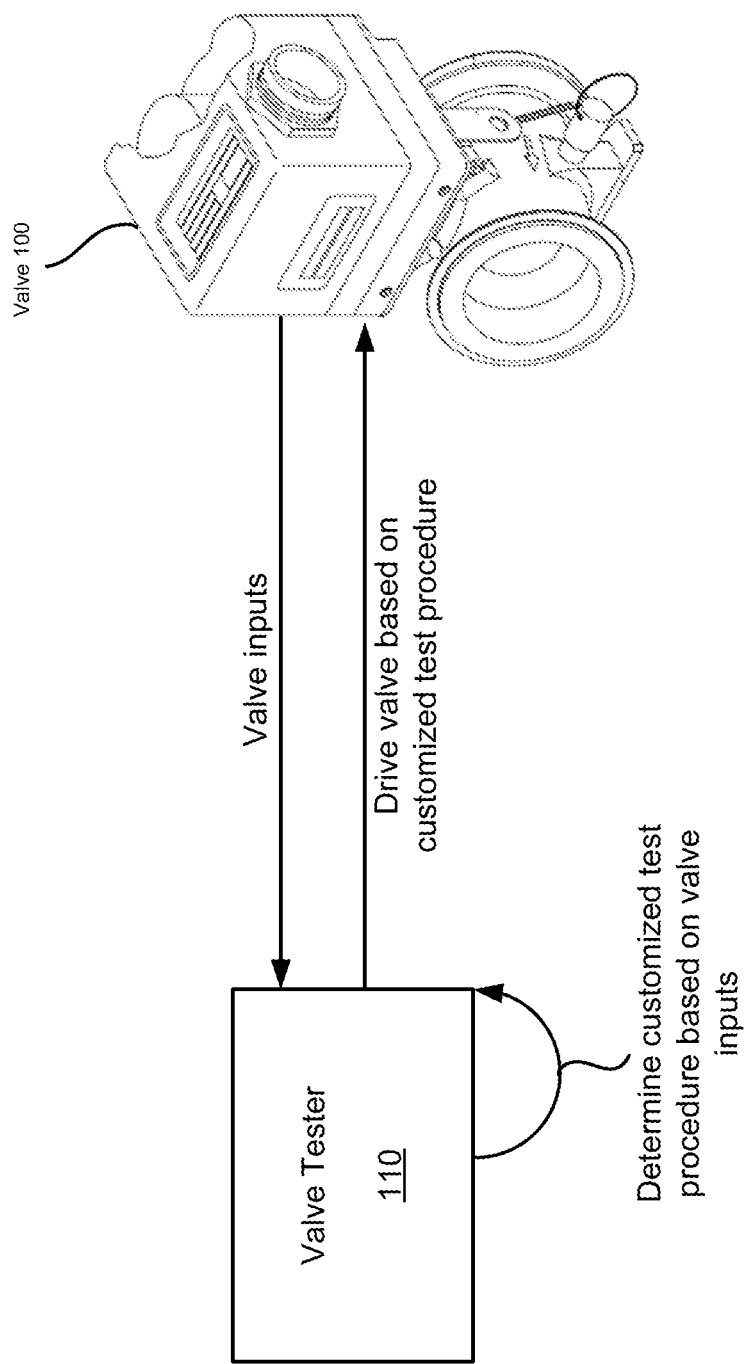
FIG. 1 shows an overview of an example implementation for testing a valve with consideration to open and close limits for the valve.

FIG. 1 shows an overview of an example implementation for testing a valve with consideration to open and close limits for the valve. As shown in FIG. 1, valve tester 110 may obtain valve inputs from valve 100. In embodiments, valve 100 may be a hot trim valve driven by a stepper motor. In embodiments, tester 110 may obtain inputs, such as an open limit clockwise value, e.g., a limit that valve 100 may be opened in a clockwise direction, a close limit counterclockwise value, e.g., a limit that valve 100 may be closed in a counterclockwise direction, and a test direction, e.g., a direction in which valve 100 should be driven during a test operation, e.g., a clockwise or counterclockwise direction. Based on these inputs, tester 110 may determine a customized test procedure for valve 100, and drive valve 100 based on the customized test procedure. The customized test procedure is determined with consideration to the number of input terminals, rotation steps, and open/close limits of valve 100 so that these limits are not exceeded when testing valve 100. For example, as valve 100 is being tested, valve 100 may approach its open or close limit, depending on the test direction.

Tester 110 may continue to test valve 100 until a limit is reached, at which point a visual indication maybe provided. If the input signal continues in the same direction after the limit is reached, audible and visual error indication may be provided, at which time the test may be discontinued to prevent damage of valve 100. Tester 110 may be reprogrammed with different the number of input terminals, rotation steps, and open/close limits of other types of valves with different open/close limits. Tester 110 may run a customized test for other types of valves with consideration to the number of input terminals, rotation steps, and open/close limits of the valve, and without exceeding the limits. For example, the open and close limits for one valve may be obtained, and testing of the valve is performed, as described herein, without exceeding the open and close limits for the valve. The open and close limits, rotation steps for another, different valve may be obtained, and testing of the other valve is performed, as described herein, without exceeding the open and close limits for the other valve. As a result, different valves with different input terminals, rotation steps, and open and close limits may be tested with consideration to the different open and close limits using the same test equipment.

Figure 2:
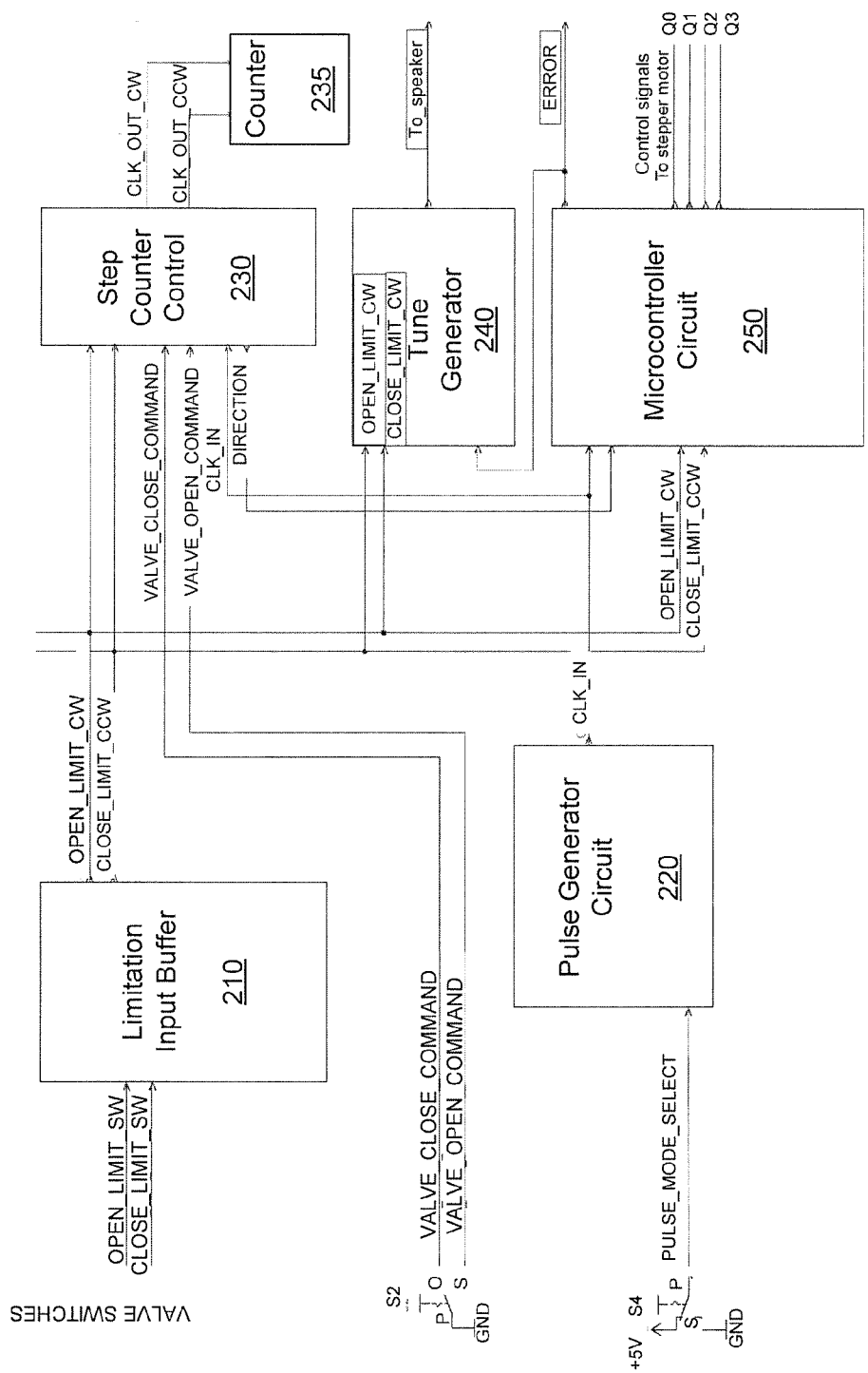
FIG. 2 shows a block diagram of example components in accordance with aspects of the present invention.

FIG. 2 shows a block diagram of example components in accordance with aspects of the present invention. As shown in FIG. 2, limitation input buffer 210 may receive an "OPEN_LIMIT_SW" signal, and a "CLOSE_LIMIT_SW" signal, e.g., from switches of valve. The "OPEN_LIMIT_SW" signal may indicate the open or clockwise direction limit for the valve, whereas the "CLOSE_LIMIT_SW" signal may indicate the close or counterclockwise direction limit for a valve. Limitation input buffer 210 may output corresponding buffered limit signals, e.g., the "OPEN_LIMIT_CW" and "CLOSE_LIMIT_CCW" signals to step counter controller 230 and microcontroller circuit 250. As described herein, microcontroller circuit 250 may be programmed with the "OPEN_LIMIT_CW" and "CLOSE_LIMIT_CCW" signals to run a customized test for the valve without exceeding the open and close limits of valve 100.

Pulse generator circuit 220 may output a test signal, e.g., the "CLK_IN" signal to microcontroller circuit 250. As described herein, the "CLK_IN" signal may initiate a test procedure for a valve. Pulse generator circuit 220 may receive a "PLUSE_MODE_SELECT" signal, e.g., from a mode selection switch. The "PLUSE_MODE_SELECT" signal may cause pulse generator circuit 220 to operate in either a continuous mode or a discrete mode. When operating the continuous mode, pulse generator circuit 220 may continuously output the "CLK_IN" signal in order to continuously run the valve as part of a continuous mode test. When continuously running the valve, the stepper motor of the valve continuously runs, and the position of the valve continuously moves towards either its open limit or close limit, depending on the testing direction. When operating in the discrete pulse mode, pulse generator circuit 220 may output the "CLK_IN" signal each time a switch is manually closed or pressed. For example, an operator may manually press a CLK_IN switch to initiate a discrete test on the valve. Additional details regarding pulse generator circuit 220 are described with respect to FIG. 4.

Step counter controller 230 may receive the OPEN_LIMIT_CW" and "CLOSE_LIMIT_CCW" signals, e.g., from limitation input buffer 210. Step counter controller 230 may further receive a "VALVE_CLOSE_COMMAND" signal, e.g., from a valve, when the valve is driven in a close or counterclockwise direction, e.g., by a stepper motor of the valve. Step counter controller 230 may also receive a "VALVE_OPEN_COMMAND" signal from the valve when the valve is driven in an open or clockwise direction. As described herein, step counter controller 230 may count a number of steps that the stepper motor of the valve has taken. The number of steps may correspond to the position of the valve in relation to the initial position of the test.

In embodiments, step counter controller 230 may output a "CLK_OUT_CW" signal and a "CLK_OUT_CCW" signal to counter 235. The "CLK_OUT_CW" indicates the number of steps that stepper motor has taken in the clockwise direction, and the "CLK_OUT_CCW" signal indicates the number of steps that the stepper motor has taken in the counterclockwise direction. Step counter controller 230 may receive "DIRECTION" to accurately compute the number of steps the stepper motor has taken in the particular direction in relation to the previous position and direction in order to drive the valve. As described herein, the direction may be a variable that microcontroller circuit 250 may use to control the stepper motor of the valve during a testing procedure.

Tune generator 240 may receive the OPEN_LIMIT_CW" and "CLOSE_LIMIT_CCW" signals, e.g., from limitation input buffer 210. Tune generator 240 may also receive an "ERROR" signal from microcontroller circuit 250, e.g., when an open or close limit for a valve has been reached and the microcontroller circuit 250 continues to receive input signal(s) to exceed the valve current position, as described in greater detail herein. Tune generator 240 may output an audio signal to a speaker based on receiving the "ERROR" signal. The frequency, tone, and/or pitch of the audio signal may be different based on whether the open limit or the closed limit of the valve has been reached.

Microcontroller circuit 250 may receive the "CLK_IN" signal, e.g., from pulse generator circuit 220, the OPEN_LIMIT_CW" and "CLOSE_LIMIT_CCW" signals, e.g., from limitation input buffer 210, and the "DIRECTION" signal. Microcontroller circuit 250 may also store a step index. The step index may include a list of tests to be performed on the valve. Each test may identify a set of stepper motor control signals that control the position of the valve. For example, test #1 may identify a first set of stepper motor control signals, test #2 may identify a second set of stepper motor control signals, etc. The tests and corresponding sets of stepper motor control signals may be configurable based on any desired testing standard and/or testing technique.

Microcontroller circuit 250 may also store a step index count that identifies a current test to perform. For example, a step index count of 1 may identify that test #1 should be performed, e.g., by outputting the set of stepper motor control signals associated with test #1. The step index count may be incremented each time a test is performed, e.g., each time a set of stepper motor control signals is output. As described herein, the step index count may be reset, e.g., to 1, when a maximum step index count value has been reached. The maximum step index count value may be based on the number of tests that microprocessor circuit 250 may perform. By way of illustrative example, assume that microprocessor circuit 250 may perform 4 tests, e.g., microprocessor circuit 250 stores 4 sets of stepper motor outputs. When the step index count is at 4, the step index count may be reset to 1 after test #4 is performed.

Microcontroller circuit 250 may initiate a test based on receiving a clean "CLK_IN" signal, e.g., a signal that is substantially free of noise. As described herein, microcontroller circuit 250 may initiate a test without receiving a "CLK_IN" signal, e.g., when an initial test is run. As described herein, microcontroller circuit 250 may store a firstRUN value of "TRUE" or "FALSE" based on whether a previous test has been run since microcontroller circuit 250 was last initialized. If the firstRUN value is TRUE, a test may be initiated independently of receiving a CLK_IN signal.

Microcontroller circuit 250 may initiate a test by communicating with counter 235 to determine whether a valve has reached an open or close limit, e.g., based on the number of steps that the stepper motor has taken. When the valve has not reached its open or close limit, microcontroller circuit 250 may output, to the stepper motor of the valve, a set of control signals, e.g., "Q0", "Q1", "Q2", and/or "Q3". The set of control signals may be based on the "DIRECTION" signal and a current step index. By way of example, microcontroller circuit 250 may output a set of first control signals when the current step index count is 1. When a subsequent "CLK_IN" signal is received, and when the valve has not reached its open or close limit, microcontroller circuit 250 may increment the step index count, e.g., to 2 and output a set of control signals corresponding to the step index count of 2.

As described herein, microcontroller circuit 250 may receive a continuous "CLK_IN" signal when pulse generator circuit 220 operates in a continuous pulse mode. When receiving a continuous "CLK_IN" signal, microcontroller circuit may continuously output different sets of control signals "Q0", "Q1", "Q2", "Q3" in accordance with incrementing step indexes until the open or close limit of the valve has been reached. In embodiments, microcontroller circuit 250 may receive a discrete "CLK_IN" signal when pulse generator circuit 220 operates in discrete pulse mode and when an operator manually closes or presses a switch causing pulse generator circuit 220 to output the discrete "CLK_IN" signal. When receiving the discrete "CLK_IN" signal, microcontroller circuit 250 may determine whether the open or close limit the valve has not been reached, and if the limit has not been reached, microcontroller circuit 250 may output a single set of control signals in accordance with a current step index count. When a subsequent discrete "CLK_IN" signal is received, microcontroller circuit may output a single set of control signals in accordance with the subsequent step index count, e.g., assuming that the open or close limit the valve has not been reached.

Microcontroller circuit 250 may output an "ERROR" signal when a current position of the valve has reached its open or close limit and the microcontroller circuit 250 continues to receive input signal(s) to exceed the valve current position. For example, as tests are being performed on the valve, e.g., as control signals are output to the stepper motor, the position of the valve may approach its open or close limit. In embodiments, the "ERROR" signal may be output to tune generator 240. Additionally, or alternatively, the "ERROR" signal may illuminate an LED indicating that the valve has reached its open or close limit and the microcontroller circuit 250 continues to receive input signal(s) to exceed the valve current position. In this way, microcontroller circuit 250 may perform a "customized" test for the valve with consideration to the number of input terminals, rotation steps, and the open and close limits for the valve in which the valve is tested only up until the open or close limit is reached. Once a limit is reached, the testing may be discontinued to prevent the valve from exceeding its limit.

Microcontroller circuit 250 may replace functionalities of traditional analog testing circuits and procedures. As a result, testing circuits are significantly downsized and simplified. Microcontroller circuit 250 performs any number of programmable tests with consideration to the different design constraints of different types of valves. As a result, microcontroller circuit 250 may be used in lieu of specialized testing equipment and circuits for each specific type of valve.

Figure 3:
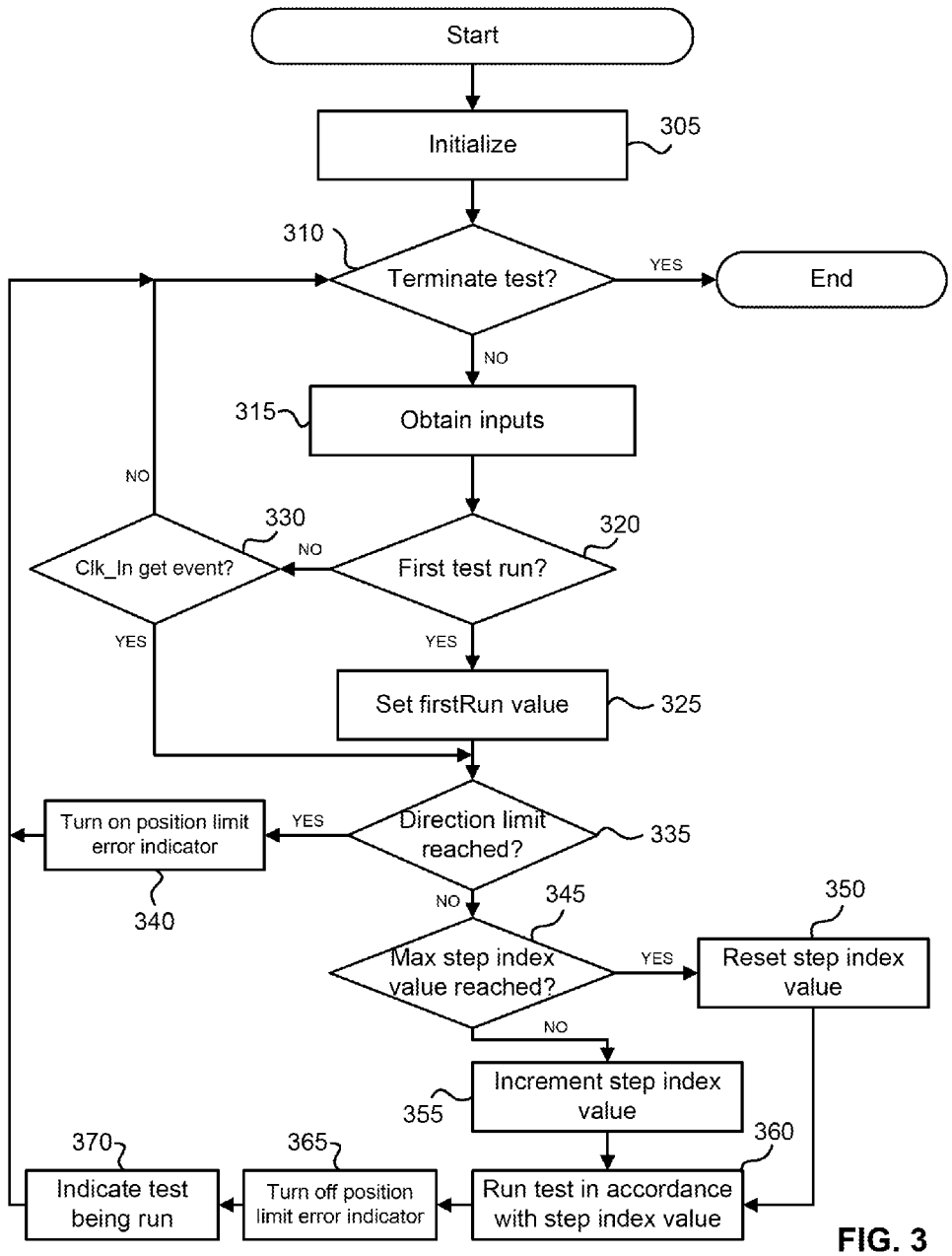
FIG. 3 shows a flowchart of steps to test a valve within the open and close limits of the valve in accordance with aspects of the present invention.

FIG. 3 shows a flowchart of processes in accordance with aspects of the present invention. The flowchart FIG. 3 illustrates the architecture, functionality, and operation of possible implementations of systems, methods, and computer program products according to various embodiments of the present invention. In this regard, each block in the flowchart may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustration, and combinations of blocks in the flowchart illustration, can be implemented by special purpose hardware-based systems that perform the specified functions or acts or carry out combinations of special purpose hardware and computer instructions. The process described herein can be implemented as a computer program product which may include a computer readable storage medium (or media) having computer readable program instructions thereon for causing a processor to carry out aspects of the invention. The computer readable storage medium is any physical storage medium or device and should not be interpreted as a non-transient signal, per se.

FIG. 3 shows a flowchart for testing a valve within the open and close limits of the valve. At step 305, an initialization procedure may be performed in which a step index count is reset, a firstRun value is reset to "TRUE", input/output ports are initialized, a position of a valve is reset to a default position, and open and close limits are cleared, and other parameters and/or variables are reset.

At step 310, a determination may be made as to whether to terminate testing. For example, at step 310, a testing procedure may have already been in process, e.g., if a continuous "CLK_IN" signal is outputted by pulse mode generator 220. If shutdown of a test that is currently in progress is desired, an operator may select to terminate the test (step 310—YES), thereby ending the testing process. Also, a test may be automatically shut down if the open or close limit of the valve has been reached.

If, on the other hand, an initial test is being performed and/or if it is not indicated that the testing should be terminated (step 310—NO), inputs for the valve may be obtained, at step 315. For example, the open and close limits, e.g., corresponding to the "OPEN_LIMIT_CW" and "CLOSE_LIMIT_CW" signals may be obtained. Also, the "DIRECTION" signal may be obtained. In embodiments, the "DIRECTION" signal may be manually selected by an operator based on a desired test direction for the valve. As described herein, the "DIRECTION" signal may be automatically selected. For different types of valves, different open and close limits may be obtained, thus permitting the different types of valves to be tested without exceeding the open and close limits. In a sense, the open and close limits are used to perform "customized" tests for the valve with consideration to the valve's open and close limits. In embodiments, the open and close limits may be stored. As described herein, a current position of the valve may be compared to the stored open and close limits to determine if a direction limit, e.g., an open or close limit, has been reached.

In embodiments, different valves with different open/close limits may be tested so as to not exceed the open/close limits. For example, at step 315, the open and close limits for one valve may be obtained, and testing of the valve is performed, as described herein, without exceeding the open and close limits for the valve. This same process, using the same test equipment, without modification, can be used for different valves. As a result, different valves with different open and close limits may be tested with consideration to the different open and close limits using the same test circuitry in accordance with aspects of the invention.

At step 320, a determination may be made as to whether a first test is being run. For example, the determination may be made based on the firstRUN value. If the firstRUN value is TRUE (step 320—YES), as is the case after initialization at step 305 and before any tests have been run, the firstRUN value may then be set, at step 325, to FALSE, e.g., such that on a subsequent test cycle, a determination may be made that a first test is not being run. If, on the other hand, the firstRUN value is FALSE (step 320—NO), as is the case after any tests have been run since the initialization at step 305, a determination is made, at step 330, as to whether a CLK_IN get event has occurred. For example, the CLK_IN get event may occur when a clean CLK_IN signal is received, e.g., a CLK_IN signal without substantial amounts of noise and/or jitter.

In embodiments, the CLK_IN signal, output by pulse generator circuit 220 may be unstable or noisy, e.g., while the pulse generator circuit 220 is outputting either a continuous or discrete CLK_IN signal. If a determination has been made that the CLK_IN get event has not occurred (step 330—NO), step 310 may be repeated to determine whether to terminate the testing process. For example, a determination may be made that the CLK_IN get event has not occurred if a continuous CLK_IN signal is unstable, or, in the case where pulse generator circuit 220 is set to discrete pulse mode, an operator has not manually closed or pressed the switch on pulse generator circuit 220 to output the CLK_IN signal.

If, on the other hand, a determination has been made that the CLK_IN get event has occurred (step 330—YES), or if a determination has been made that a first test is being run (step 320—YES), a determination is made as to whether the direction limit has been reached on the valve (step 335). The direction limit may correspond to either an open limit or a close limit based on the direction signal received at step 315. For example, if the "DIRECTION" signal was "open" or "clockwise," the direction limit corresponds to the limit identified by the "OPEN_LIMIT_CW" signal. If the direction signal was "close" or "counterclockwise," the direction limit corresponds to the limit identified by the "CLOSE_LIMIT_CCW" signal. The determination is made as to whether the direction limit has been reached further based on the current position of the valve, e.g., as identified by counter 235. For example, the current position of the valve is compared to the direction limit. If the current position of the valve matches the direction limit, a determination is made that the direction limit has been reached. As described herein, the position of the valve moves towards the direction limit during testing of the valve. Thus, the direction limit will eventually be reached as testing on the valve continues.

If, for example, the direction limit has been reached (step 335—YES), a position limit indicator may be turned on, such as an LED or other type of indicator (step 340). If, for example, the direction limit has been reached (step 335—YES) and the input signal continues to be received trying exceed the valve current position, a position limit error indicator may be turned on, such as an LED or other type of indicator (step 340). Further, an error signal may be output to tune generator 240. The error signal may indicate that either open or close limit is being exceeded based on the direction signal obtained at step 315. Further, step 310 may be repeated to determine whether to terminate the testing process, e.g., since the direction limit has been reached. At this point, the testing process could be terminated, if desired, or it may be re-run by obtaining the inputs at step 315 as described herein. The illumination of the position limit error indicator may indicate, to the operator, that the direction should be switched in order to drive the valve in the opposite direction during testing. In embodiments, the "DIRECTION" input may automatically be switched when the direction limit has been reached. Thus, at step 315, the "DIRECTION" input may be the opposite direction as the limit error. When step 335 is subsequently performed, a determination is made that the direction limit has not been reached (step 335—NO).

When the determination is made that the direction limit has not been reached (step 335—NO), a determination is made as to whether the maximum step index has been reached (step 345). For example, as described herein, a step index count may be stored as tests are being performed, and the step index count may be incremented each time a test is performed. A maximum step index value may be configurable and can be based on the number of tests that can be performed on the valve. If, for example, the maximum step index value has been reached (step 345—YES), the step index value may be reset (at step 350), e.g., to 0 or 1. If, on the other hand, the maximum step index value has not been reached (step 345—NO), the step index value may be incremented, e.g., to the next whole integer (at step 355).

At step 360, a test may be run in accordance with the step index value. For example, based on the step index value a particular set of control signals may be output to the valve, e.g., to the stepper motor. By way of illustrative example, if the step index value is 1, test #1 may be run by outputting a first set of control signals corresponding to test #1. Since the test is run when the open/close limits of the valve have not been reached, and the test is not run when the open/close limits have been reached, the test is customized for the valve so as to not exceed the open/close limits.

At step 365, the position limit error indicator may be turned off, e.g., if the position limit error indicator was previously on and the valve is moving to the opposite direction. At step 370, the particular test that is currently being run may be visually indicated, e.g., by illuminating one or more LEDs representing the test being run. For example, particular LEDs may be illuminated to indicate that test #1 is being run. If a discrete test was run, e.g., if pulse mode generator 220 output a discrete CLK_IN signal, or if a first test was run since the initialization at step 305, an operator may select to continue with additional tests (step 310—NO), or end the testing process (step 310—YES). If pulse mode generator 220 is outputting a continuous CLK_IN signal, a default determination may be made to continue with the testing process (step 310—NO), unless the test is terminated by the operator (step 310—YES). In the case of continuous testing, e.g., when pulse mode generator 220 is outputting a continuous CLK_IN signal, the testing process of FIG. 3 may continue, and different tests, corresponding to incrementing step index values, may be performed until the direction limit is reached.

Figure 4:
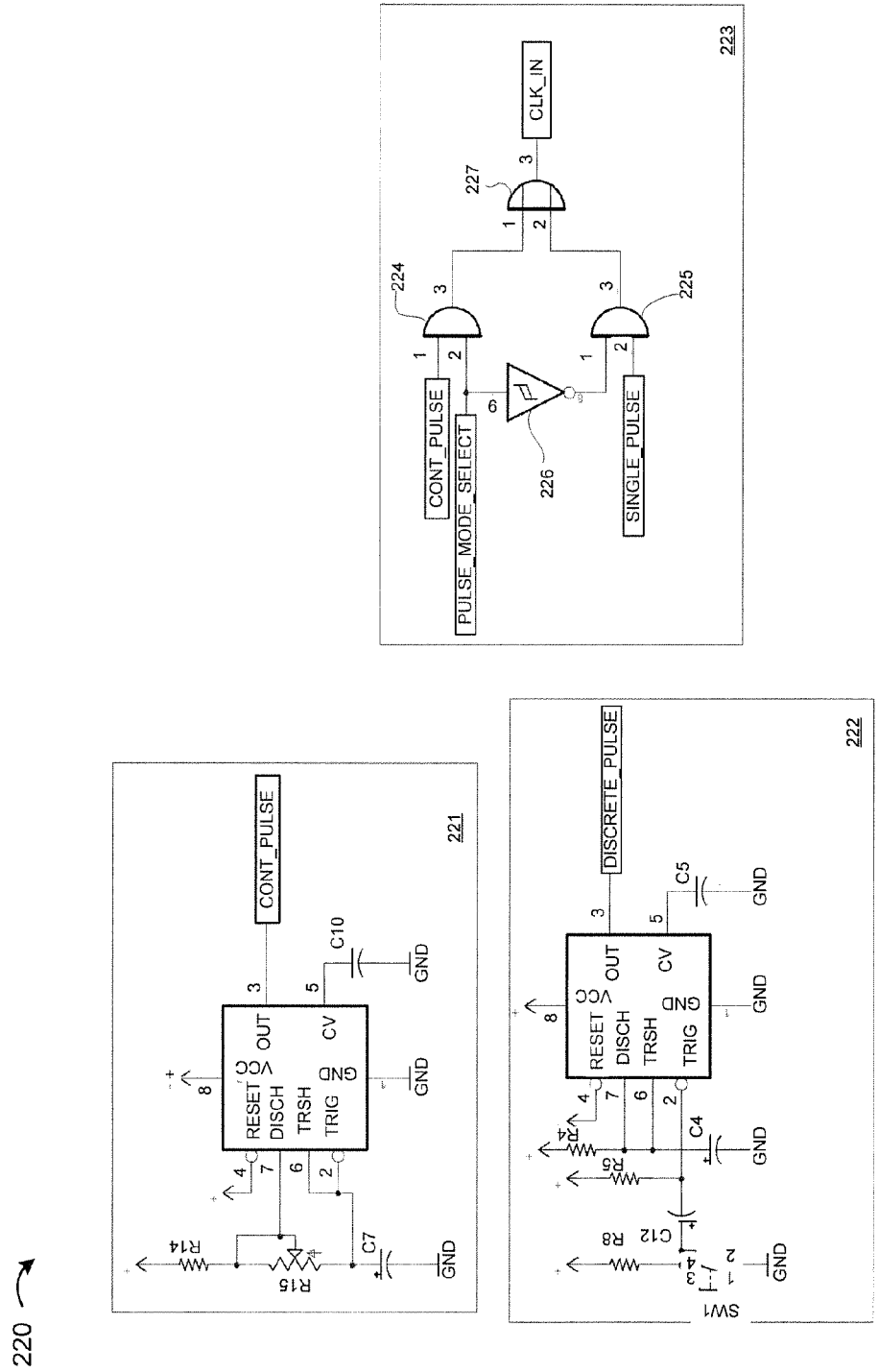
FIG. 4 shows details of a pulse mode selector in accordance with aspects of the present invention.

FIG. 4 shows details of an exemplary pulse mode selector in accordance with aspects of the present invention. As should be understood by those of skill in the art, the pulse mode generator shown in FIG. 4 is an illustrative non-limiting example. Accordingly, other pulse mode generators can be implemented in accordance with aspects of the invention.

As shown in FIG. 4, pulse mode generator 220 may include continuous pulse mode circuit 221, discrete pulse mode circuit 222, and clock signal generator circuit 223. As should be understood by those of skill in the art, continuous pulse mode circuit 221, discrete pulse mode circuit 222, and clock signal generator circuit 223 shown in FIG. 4 are illustrative non-limiting examples. Accordingly, other continuous pulse mode circuits 221, discrete pulse mode circuits 222, and clock signal generator circuits 223 can be implemented in accordance with aspects of the invention. Continuous pulse mode circuit 221 may include terminals 1-8. Terminals 1, 2, 5, and 6 may be connected to a ground source, e.g., via capacitors C7 and C10. Terminals 4 may be connected to a power source. Terminal 7 is a discharge control terminal. Terminal 8 may be connected to receive a $V_{CC}$ voltage. Based on PULSE_MODE_SELECT switch, continuous pulse mode circuit 221 may output, e.g., to clock signal generator circuit 223, a "CONT_PULSE" signal, e.g., at frequency range of 0-200 Hertz (Hz), or at another frequency range.

Discrete pulse mode circuit 222 may include terminals 1-8. Terminal 8 may be connected to receive a $V_{CC}$ voltage. SW1 may be manually closed, e.g., by an operator. When SW1 is closed, a signal is provided to discrete pulse mode circuit 222, e.g., via resisters R8, and R15, and capacitor C12. When SW1 is closed, it generates a signal by changing the voltage, then discrete pulse mode circuit 222 may output a "DISCRETE_PULSE" signal, e.g., to Clock signal generator circuit 223.

Pulse mode generator 220 may operate in a continuous pulse mode or a discrete pulse mode, e.g., based on a position of a "PLUSE_MODE_SELECT" switch, as previously shown in FIG. 2. For example, when the PLUSE_MODE_SELECT switch is set to a continuous pulse mode, continuous pulse mode circuit 221 continuously outputs a "CONT_PULSE" signal, e.g., to clock signal generator circuit 223. When the PLUSE_MODE_SELECT switch is set to a discrete pulse mode, discrete pulse mode circuit 222 may output a "DISCRETE_PULSE" signal when switch SW1 is closed, e.g., manually pressed or closed by an operator.

Clock signal generator circuit 223 may receive, e.g., at logic gate 224, a "PULSE_MODE_SELECT" signal, e.g., from a "PULSE_MODE_SELECT" switch, indicating either a continuous pulse mode or a discrete pulse mode. For example, the "PULSE_MODE_SELECT" signal may be a binary bit, indicating either a continuous pulse mode or a discrete pulse mode. Alternatively, when operating in the discrete pulse mode, "PULSE_MODE_SELECT" signal may not be received, and a bit of 0 may be interpreted by logic gate 224.

Further, logic gate 224 may receive a "CONT_PULSE" signal, e.g. when continuous pulse mode circuit 221 outputs the "CONT_PULSE" signal. Alternatively, when pulse mode generator 220 operates in the discrete pulse mode, continuous pulse mode circuit 221 may not output the "CONT_PULSE" signal, and a bit of 0 may be interpreted by logic gate 224. As further shown in FIG. 4, logic gate 225 may receive the "PULSE_MODE_SELECT" signal, e.g., via logic gate 226, and may also receive the "DISCRETE_PULSE" signal when pulse mode generator 220 operates in the discrete pulse mode (or logic gate 225 may interpret a bit of 0 when the DISCRETE_PULSE" signal is not received). Logic gate 227 may receive outputs of logic gate 224 and logic gate 225, and may output a "CLK_IN" signal. Either a continuous or discrete "CLK_IN" signal is output by logic gate 227 based on the "PULSE_MODE_SELECT" signal. For example, if the "PULSE_MODE_SELECT" signal indicates a continuous pulse mode, logic gate 227 may output a continuous "CLK_IN" signal. Otherwise, logic gate 227 may output a discrete "CLK_IN" signal each time the "DISCRETE PULSE" signal is received, e.g., when switch SW1 of discrete pulse mode circuit 222 is closed.

Figure 5:
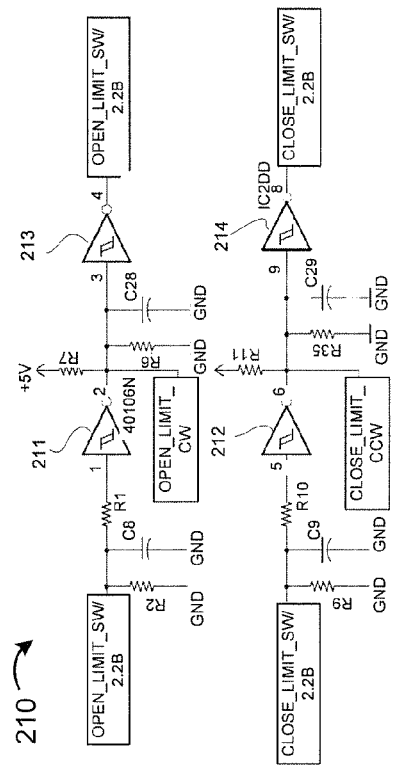
FIG. 5 shows details of a limitation input buffer in accordance with aspects of the present invention.

FIG. 5 shows details of an exemplary limitation input buffer in accordance with aspects of the present invention. As should be understood by those of skill in the art, the limitation input buffer shown in FIG. 5 is an illustrative non-limiting example. Accordingly, other limitation input buffers can be implemented in accordance with aspects of the invention.

As shown in FIG. 5, logic gate 211 of limitation input buffer 210 may receive an "OPEN_LIMIT_SW" signal, e.g., from an open limit switch of a valve, indicating the open limit of the valve. For example, the open limit switch of the valve may be closed when the open limit is reached. In embodiments, logic gate 211 may receive the "OPEN_LIMIT_SW" signal via resistor R1. Further, grounding resistor R2 and grounding capacitor C8 may be provided. Logic gate 212 of limitation input buffer 210 may receive a "CLOSE_LIMIT_SW" signal, e.g., from a close limit switch of the valve, indicating the close limit of the valve. In embodiments, logic gate 212 may receive the "CLOSE_LIMIT_SW" signal via resistor R10. Further, grounding resistor R9 and grounding capacitor C9 may be provided as a filter. The output of logic gate 211 may be supplying the input of an inverted "OPEN_LIMIT_CW", and provided to logic gate 213. Further, grounding resistor R6 and grounding capacitor C28 may be provided as a filter. The output of logic gate 212 may be supplying the input of an inverted "CLOSE_LIMIT_CCW" signal, and provided to logic gate 214. Further, grounding resistor R35 and grounding capacitor C289 may be provided as a filter. Logic gate 213 may output, e.g., to microcontroller circuit 250 and/or step counter controller 230, a buffered "OPEN_LIMIT_CW" signal, corresponding to the "OPEN_LIMIT_SW" signal. Further, logic gate 214 may output, e.g., to microcontroller circuit 250 and/or step counter controller 230, a buffered "CLOSE_LIMIT_CCW" signal, corresponding to the "CLOSE_LIMIT_SW" signal.

Figure 6:
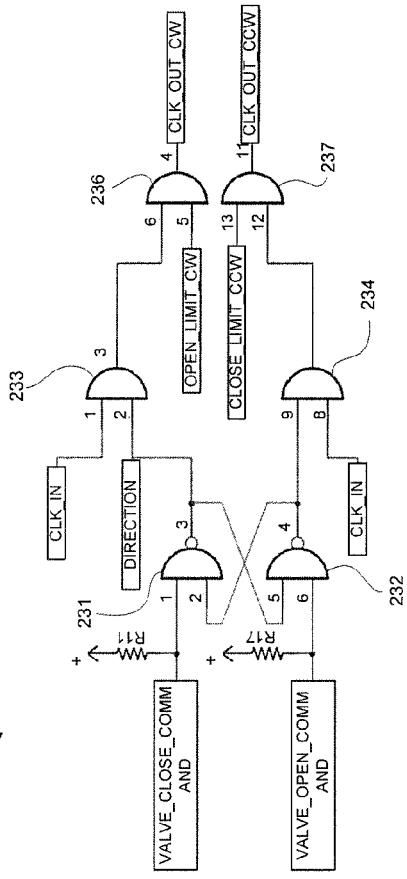
FIG. 6 shows details of a step counter controller in accordance with aspects of the present invention.

FIG. 6 shows details of an exemplary step counter controller in accordance with aspects of the present invention. As should be understood by those of skill in the art, the step counter controller shown in FIG. 6 is an illustrative non-limiting example. Accordingly, other step counter controllers can be implemented in accordance with aspects of the invention.

As shown in FIG. 6, logic gate 231 of step counter controller 230 may receive, e.g., from a valve, when the valve is driven in a close or counterclockwise direction by a stepper motor of the valve, a "VALVE_CLOSE_COMMAND" signal combined with a voltage provided via resistor R16. Logic gate 232 of step counter controller 230 may receive, e.g., from a valve when the valve is driven in an open or clockwise direction, a "VALVE_OPEN_COMMAND" signal combined with a voltage provided by resistor R17. A "DIRECTION" signal is output to microcontroller circuit 250 to indicate the direction in which the valve is being driven. In embodiments, logic gate 233 may receive the "CLK_IN" signal, e.g., from pulse mode generator 220, and the "DIRECTION" signal. And logic gate 234 may receive the "CLK_IN" signal, e.g., from pulse mode generator 220, and the inverted "DIRECTION" signal. Logic gate 236 may receive the output of logic gate 233, and the "OPEN_LIMIT_CW" signal, e.g., from limitation input buffer 210. Logic gate 237 may receive the output of logic gate 234 and the "CLOSE_LIMIT_CCW" signal, e.g., from limitation input buffer 210. Logic gate 236 may output a "CLK_OUT_CW" signal, and logic gate 237 may output a "CLK_OUT_CCW" signal, e.g., to counter 235. The "CLK_OUT_CW" indicates the number of steps that stepper motor has taken in the clockwise direction, and the "CLK_OUT_CCW" signal indicates the number of steps that the stepper motor has taken in the counterclockwise direction.

Figure 7:
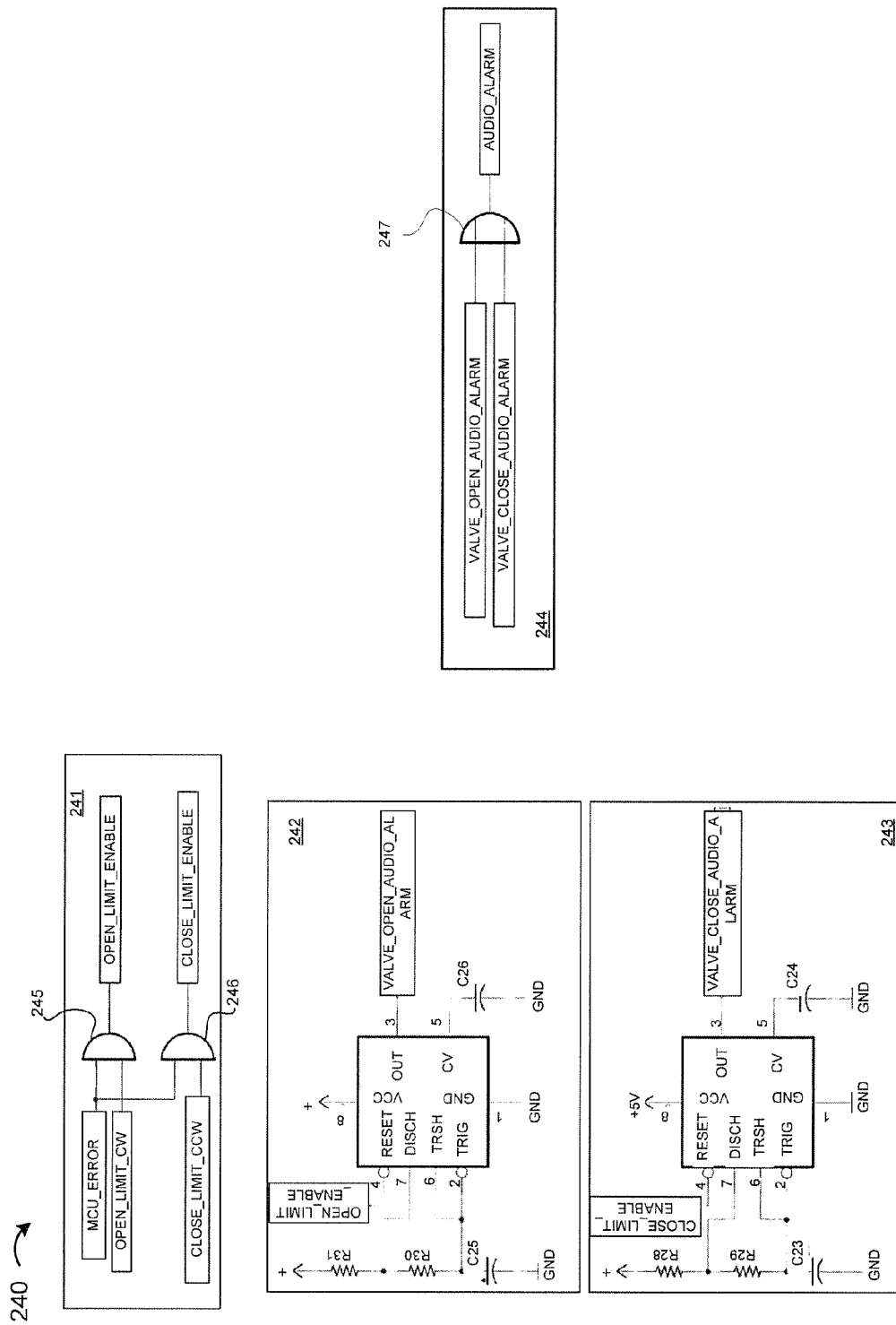
FIG. 7 shows details of a tune generator in accordance with aspects of the present invention.

FIG. 7 shows details of an exemplary tune generator in accordance with aspects of the present invention. As should be understood by those of skill in the art, the limitation input buffer shown in FIG. 7 is an illustrative non-limiting example. Accordingly, other tune generators can be implemented in accordance with aspects of the invention As shown in FIG. 7, tune generator 240 may include error limit enable circuit 241, open audio alarm circuit 242, close audio alarm circuit 243, and audio output circuit 244. As should be understood by those of skill in the art, error limit enable circuit 241, open audio alarm circuit 242, close audio alarm circuit 243, and audio output circuit 244 shown in FIG. 7 are illustrative non-limiting examples. Accordingly, other error limit enable circuits 241, open audio alarm circuits 242, close audio alarm circuits 243, and audio output circuits 244 can be implemented in accordance with aspects of the invention. Logic gate 245 of error limit enable circuit 241 may receive the "OPEN_LIMIT_CW" signal, e.g., from limitation input buffer 210. Logic gate 245 may also receive an "MCU_ERROR" signal from microcontroller circuit 250, e.g., when an open or close limit for a valve has been reached. Logic gate 245 may output an "OPEN_LIMIT_ENABLE" signal, e.g., when the "MCU_ERROR" signal indicates that the open limit for the valve has been reached. Logic gate 246 may receive the "CLOSE_LIMIT_CCW" signal, e.g., from limitation input buffer 210, and the "MCU_ERROR" signal from microcontroller circuit 250. Logic gate 246 may output the "CLOSE_LIMIT_ENABLE" signal, e.g., when the "MCU_ERROR" signal indicates that the open limit for the valve has been reached.

Open audio alarm circuit 242 may be connected to voltage and ground sources at terminals 1, 2, 5, 6, 7, and 8, e.g., via resistors R30, R31, and capacitors C25 and C26. Terminal 4 of open audio alarm circuit 242 may receive the "OPEN_LIMIT_ENABLE" signal from logic gate 245 to activate circuit 242 to generate a frequency through terminal 3. Open audio alarm circuit 242 may output a VALVE_OPEN_AUDIO_ALARM" to audio output circuit 244 based on receiving the OPEN_LIMIT_ENABLE" signal.

Close audio alarm circuit 243 may be connected to voltage and ground sources at terminals 1, 2, 5, 6, 7 and 8, e.g., via resistors R28, R29, and capacitors C23 and C24. Terminal 4 of close audio alarm circuit 243 may receive the "CLOSE_LIMIT_ENABLE" signal from logic gate 246 to activate circuit 243 to generate a frequency through terminal 3. Close audio alarm circuit 243 may output a VALVE_CLOSE_AUDIO_ ALARM" to audio output circuit 244 based on receiving the CLOSE_LIMIT_ENABLE" signal.

The logic gate 247 may output an "AUDIO_ALARM" signal, e.g., to a speaker. The "AUDIO_ALARM" signal corresponds to either the "VALVE_OPEN_AUDIO_ALARM" signal or the "VALVE_CLOSE_AUDIO_ALARM" signal.

Audio output circuit 244 may include a logic gate 247 that receives the "VALVE_OPEN_AUDIO_ALARM" signal and/or the "VALVE_CLOSE_AUDIO_ALARM" signal. Logic gate 247 may interpret the "VALVE_OPEN_AUDIO_ALARM" as 1 when received, or as 0 when not received. Logic gate 247 may interpret the "VALVE_CLOSE_AUDIO_ALARM" as 1 when received, or as 0 when not received. Logic 247 may output, e.g., to a speaker, an "AUDIO_ALARM" signal, corresponding to either the "VALVE_OPEN_AUDIO_ALARM" signal or the "VALVE_CLOSE_AUDIO_ALARM" signal, e.g., whichever one is received. In embodiments, the tone, pitch, and/or frequency of the "AUDIO_ALARM" signal may different based on whether the signal corresponds to the "VALVE_OPEN_AUDIO_ALARM" signal or the "VALVE_CLOSE_AUDIO_ALARM" signal.

While embodiments of the present invention are described herein in terms of testing various types of valves, in practice, the embodiments are not so limited. For example, in embodiments, other types of devices driven by stepper motors for motion-control positioning may be tested in accordance with aspects of the present invention, e.g., floppy disk drivers, flatbed scanners, printers, copiers, fax machines, fans, electrical windows/doors, 3D printers, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   providing a computing device to change a position of a valve;
   obtaining, by the computing device, a direction limit for a valve, wherein the valve is electronically controlled;
   obtaining, by the computing device, a test direction input for the valve;
   obtaining, by the computing device, a pulse mode, wherein the pulse mode is selectable between continuous and discrete testing of the valve;
   determining, by the computing device, whether the direction limit of the valve has been reached based on a current position of the valve and the test direction input;
   determining, by the computing device, whether the direction limit is being exceeded based on a current position of the valve and the test direction input;
   running, by the computing device, a customized test on the valve in a direction of the test direction input based on a test procedure that determines the movement of the valve in clockwise or counter clockwise direction without the current position of the valve exceeding the direction limit, wherein the customized test procedure is further based on the pulse mode;
   actively comparing, by the computing device, the current position of the valve with the direction limit while running the customized test; and discontinuing, by the computing device, the test procedure when the current position of the valve reaches the direction limit.

2. The method of claim 1, further comprising:
outputting an indication when the current position of the valve reaches the direction limit,
wherein when the customized procedure is based on a continuous pulse mode, the method further comprises continuously outputting a signal to continuously run the valve,
wherein when the customized procedure is based on a discrete pulse mode, the method further comprises outputting the signal each time a switch is manually closed or pressed to run the valve manually.

3. The method of claim 1, further comprising:
outputting an error when exceeding the position of the valve direction limit.

4. The method of claim 3, wherein the outputting the error includes outputting an audible alert.

5. A method comprising:
obtaining, by a computing device, a direction limit for a valve, wherein the valve is electronically controlled;
obtaining, by the computing device, a test direction input for the valve;
obtaining, by the computing device, a pulse mode, wherein the pulse mode is selectable for continuous or discrete testing of the valve;
determining, by the computing device, whether the direction limit of the valve has been reached based on a current position of the valve and the test direction input;
determining, by the computing device, whether the direction limit is being exceeded based on a current position of the valve and the test direction input;
running, by the computing device, a customized test on the valve in a direction of the test direction input based on a test procedure that determines the movement of the valve in clockwise or counter clockwise direction without the current position of the valve exceeding the direction limit, wherein the customized test procedure is further based on the pulse mode;
actively comparing, by the computing device, the current position of the valve with the direction limit while running the customized test;
discontinuing, by the computing device, the test procedure when the current position of the valve reaches the direction limit;
determining whether a step index count is at a maximum value prior to running the customized test;
incrementing the step index count based on determining that the step index count is not at the maximum value;
resetting the step index count based on determining that the step index count is at the maximum value, wherein determining a set of testing control signals based on the step index count, wherein running the customized test includes outputting the set of testing control signals to a stepper motor connected to the valve.

6. The method of claim 5, further comprising visually indicating the step index count.

7. The method of claim 1, wherein running the customized test includes driving a stepper motor connected to the valve.

8. The method of claim 1, wherein the valve is a trim valve for an aircraft.

9. The method of claim 1, further comprising running the customized test in an opposite direction as the test direction input based on the test procedure before or when the current position of the valve reaches the direction limit.

10. The method of claim 1, wherein running the customized test includes continuously outputting sets of control signals to drive a stepper motor connected to the valve.

11. The method of claim 1, wherein running the customized test includes outputting a set of control signals to drive a stepper motor connected to the valve.

12. A method comprising:
providing a computing device to change a position of a valve;
determining, by the computing device, whether a direction limit of a valve has been reached based on a current position of the valve, input pulses, and a test direction input, wherein the valve is electronically controlled;
running, by the computing device, a customized test on the valve in a direction of the direction input when the direction limit has not been reached, and outputting control signals to a stepper motor connected to the valve to drive the stepper motor, wherein the customized test procedure is further based on a pulse mode that is selectable between continuous and discrete testing of the valve;
actively comparing, by the computing device, the current position of the valve with the direction limit while running the customized test; and
discontinuing, by the computing device, the customized test when the current position of the valve reaches the direction limit.

13. The method of claim 12, further comprising:
outputting a visual indicator when the current position of the valve reaches the direction limit.

14. The method of claim 12, further comprising:
outputting an audible and visual error when the current position of the valve reaches the direction limit while the position of the valve direction limit is being exceeded by the input pulses.

15. The method of claim 12, further comprising determining the control signals based on a step index count, wherein the step index count increments during the customized test.

16. The method of claim 15, further comprising visually indicating the set of control signals.

17. The method of claim 12, further comprising running the customized test in an opposite direction as the test direction input when the current position of the valve reaches the direction limit.

18. The method of claim 12, wherein running the customized test includes continuously outputting sets of the control signals to drive a stepper motor connected to the valve.

19. The method of claim 12, wherein running the customized test includes outputting a single set of the control signals to drive a stepper motor connected to the valve.

20. A reprogrammable testing circuit for testing different types of valves by changing a position of a valve, the reprogrammable testing circuit being configured to:
obtain a direction limit for the valve, wherein the valve is electronically controlled;
obtain a pulse mode for the valve, wherein the pulse mode is selectable between continuous and discrete testing of the valve; and
test the valve in accordance with a customized test procedure without exceeding the direction limit of the valve, wherein the customized test procedure is further based on the pulse mode and changes the position of the valve.

* * * * *